US008356713B2

(12) United States Patent
Ogawa

(10) Patent No.: US 8,356,713 B2
(45) Date of Patent: Jan. 22, 2013

(54) RETAINER AND SUBSTRATE STORAGE CONTAINER

(75) Inventor: Osamu Ogawa, Niigata (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 15 days.

(21) Appl. No.: 12/741,168

(22) PCT Filed: Oct. 30, 2008

(86) PCT No.: PCT/JP2008/069765
§ 371 (c)(1),
(2), (4) Date: May 3, 2010

(87) PCT Pub. No.: WO2009/060782
PCT Pub. Date: May 14, 2009

(65) Prior Publication Data
US 2010/0258475 A1  Oct. 14, 2010

(30) Foreign Application Priority Data
Nov. 9, 2007 (JP) .................................. 2007-292021

(51) Int. Cl.
*B65D 85/48* (2006.01)
(52) U.S. Cl. ...................................... 206/711; 206/454
(58) Field of Classification Search .................. 206/711, 206/454, 832, 833, 710, 308.1, 309; 211/41.18; 414/936, 940
See application file for complete search history.

(56) References Cited

U.S. PATENT DOCUMENTS

| 5,228,568 | A  | * | 7/1993  | Ogino et al. ................... 206/711 |
| 6,951,284 | B2 | * | 10/2005 | Cheesman et al. ............. 206/711 |
| 7,455,181 | B2 | * | 11/2008 | Matsutori et al. ............. 206/710 |
| 2005/0161367 | A1 | * | 7/2005 | Matsutori et al. ............. 206/711 |
| 2006/0042998 | A1 |   | 3/2006 | Haggard et al. |
| 2006/0108258 | A1 |   | 5/2006 | Burns et al. |
| 2010/0025288 | A1 |   | 2/2010 | Lin et al. |

FOREIGN PATENT DOCUMENTS

| EP | 1480254 A2 | 11/2004 |
| JP | 5063064 A  | 3/1993  |
| JP | 07-302833 A | 11/1995 |

(Continued)

OTHER PUBLICATIONS

International Search Report issued in PCT/JP2008/069765, mailed on Dec. 16, 2008, with translation, 2 pages.

(Continued)

*Primary Examiner* — J. Gregory Pickett
*Assistant Examiner* — Ernesto Grano
(74) *Attorney, Agent, or Firm* — Osha Liang LLP

(57) ABSTRACT

A retainer includes a frame, a pair of first elastic parts projected from a pair of opposing parts of the frame so as to approach to each other, and a second elastic part that is supported at the bent free ends of the paired first elastic parts to hold a substrate. The outside end of the second elastic part is positioned outside the free end of the first elastic part and closer to the opposing part of the frame. Also, first and second holds for holding the rim of the substrate are formed apart from each other. The second hold is positioned on the outer end side of the second elastic part from the first hold.

11 Claims, 11 Drawing Sheets

FOREIGN PATENT DOCUMENTS

| | | |
|---|---|---|
| JP | 2000-281171 A | 10/2000 |
| JP | 2002-353301 A | 12/2002 |
| JP | 2005-320028 A | 11/2005 |
| JP | 2005-353898 A | 12/2005 |
| JP | 2006-120851 A | 5/2006 |

OTHER PUBLICATIONS

PCT Notification of Transmittal of Translation of the International Preliminary Report on Patentability mailed on Jul. 8, 2010, 5 pages.
Extended European Search Report issued in EP Application No. 08846396.3, mailed Oct. 5, 2012, (7 pages).

\* cited by examiner

RETAINER AND SUBSTRATE STORAGE CONTAINER

TECHNICAL FIELD

The present invention relates to a retainer and a substrate storage container for holding substrates such as semiconductor wafers, glass wafers and the like.

BACKGROUND ART

Though not illustrated, a conventional substrate storage container is comprised of a front-open box type container body that stores a plurality of round precision substrates or semiconductor wafers in alignment, a removable door attached to manually or automatically open and close the opening in the front of the container body and a large retainer that is deeply attached to the door's backside that opposes semiconductor wafers to hold the rims in the front of the semiconductor wafers by pairs of holds (see patent documents 1 and 2). The retainer includes elastic pieces that are horizontally extended left and right. This elastic piece is integrally formed with a pair of left and right holds that hold the rim in the front of the semiconductor wafer.

Incidentally, when the retainer enters deeply into the interior of the container body, and if attachment and removal of the door is tried to be automated, it is inevitable to take a large stroke for opening and closing the door, so that it is impossible to achieve space-saving and improve work efficiency.

For this reason, there have been proposals in prior art, in which a retainer is shallowly attached to the door's backside central part so as to reduce the stroke when the door is opened and closed and thereby realize space-saving and improved work efficiency.

Patent document 1:
  Japanese Patent Application Laid-open 2002-353301
Patent document 2:
  Japanese Patent Application Laid-open 2005-320028

DISCLOSURE OF INVENTION

Problems to be Solved by the Invention

Since, in the conventional substrate storage container, the retainer is attached to the door's backside central part as stated above and the angle formed at the center of the semiconductor wafer between the holds of the retainer is small, it is difficult to restrain semiconductor wafer's rotation. In particular, when the holding forces of the left and right holds are different, there is a fear of the semiconductor wafer easily rotating. If the semiconductor wafer rotates, the holds of the retainer are abraded, causing the problems such as production of particles, contamination of the semiconductor wafer and damage to the surface thereof.

If, in order to solve these problems, an attempt to restrain the semiconductor wafer from rotating is made by enhancing the retention of the holds of the retainer, a strong resistance occurs when the door is fitted to the front part of the container body, and the automatic door opening/closing equipment for automatic attachment and removal of the door falls beyond the specified capacity, causing a new problem that the fitting operation of the door to the container body is hard to execute.

Further, the conventional retainer merely holds the semiconductor wafer on its front rim by the hold of a single elastic piece, so that if vibration and/or impact during transportation of the substrate storage container or a large impact due to dropping acts on the semiconductor wafer, it is difficult to alleviate the impact, causing the risk of the semiconductor wafer dislodging from the hold of the elastic part or being broken.

The present invention has been devised in view of the above, it is therefore an object of the present invention to provide a retainer and a substrate storage container, which can prevent contamination and damage accompanying the turning of substrates, alleviate impacts acting on the substrates to thereby eliminate the risk of the substrates from dislodging and being broken, and which can simplify the operation of attaching the retainer-equipped door to the container body.

Means for Solving the Problems

In order to solve the above problems, the present invention resides in a retainer comprising: a frame; a pair of first elastic parts projected from a pair of opposing parts of the frame so as to approach to each other; and a second elastic part that is supported at the bent free ends of the paired first elastic parts to hold a substrate, and is characterized in that the outside end of the second elastic part is positioned outside the free end of the first elastic part and closer to the opposing part of the frame, and first and second holds for holding the rim of the substrate are formed apart from each other, the second hold being positioned on the outer end side of the second elastic part from the first hold.

Here, the frame may include a pair of opposing parts arranged apart from, and opposed to, each other and a pair of bridging parts supported at both ends between the paired opposing parts, and at least spring-like flexions and positioning portions may be formed at least in either of the opposing parts or the bridging parts.

Further, a single second elastic part may be supported between the free ends of the paired first elastic parts, and the second hold may be integrated with the outside end of the second elastic part.

Also, the first and second hold forming regions in the second elastic part may be formed to be thick while the boundary regions between the first and second hold forming regions may be formed as thin portions so that the thin portions will serve as inflexion points to bend the second hold forming regions in the circumferential direction of the substrate.

Further, a pair of second elastic parts may be supported on respective free ends of the paired first elastic parts with the inner ends of the paired second elastic parts arranged apart from, and close to, each other, and each second elastic part may be curved so as to fit along the rim of the substrate, the second hold being integrated with the outside end of the second elastic part.

Also, the first and second holds each may include a projection with a holding groove having an approximately V-shaped or approximately Y-shaped section defined by a pair of slopes, and the paired slopes in the first hold may be formed asymmetrically with respect to the vertical and horizontal directions and formed higher than the pair of slopes in the second hold.

Also, in order to solve the above problems, the present invention resides in a substrate storage container wherein an opening of a container body for storing a substrate is opened and closed by a removable door, and is characterized in that a retainer according to any one of Claims 1 through 6 is attached to the opposing surface of the door that opposes the substrate.

Here, the opposing surface of the door that opposes the substrate may be formed so as to have an approximately wavy section.

Also, a stopper for limiting excessive deformation of the first elastic part may be provided on either one of the opposing surfaces of the door and the first elastic part of the retainer.

Further, it is possible to make the first and second hold forming regions in the second elastic part form approximately obtuse angles when the first holds of the retainer and the circumferential edge of the substrate come into contact.

Further, a stopper may be provided on the opposing surface of the door that opposes the substrate, the stopper may be formed with an engagement groove defined by a pair of opposing wall faces that are inclined gradually coming closer to each other towards the bottom while an engagement piece that fits into the engagement groove of the stopper may be formed on the backside of the second hold of the retainer.

Also, a flexure-limiting rib that abuts the first elastic part before abutment between the bottom of the engagement groove and the engagement piece so as to limit excessive deformation of the first elastic part may be provided on the opposing surface of the door that opposes the substrate.

Further, a flexure-limiting rib that abuts the opposing surface of the door that opposes the substrate before abutment between the bottom of the engagement groove and the engagement piece to limit excessive deformation of the first elastic part may be provided for the first elastic part.

Here, the frame in the scope of the claims may either be vertically long or laterally long. The first elastic parts given in one pair may be provided by plural pairs. Examples of the substrate may at least include semiconductor wafers, glass wafers, liquid crystal substrates and the like of various sizes. It does not matter that the number of the second elastic parts is singular or plural. Also, it does not matter that the number of the first holds is singular or plural.

The substrate storage container is not particularly limited to being either a front open box type, top open box type that stores substrates using cassettes, bottom open box type, transparent type, opaque type, translucent type or the like. In this case, the retainer is used as a front retainer or a rear retainer depending on the type of the substrate storage container. Further, the engagement piece may be formed as appropriate in the first elastic part, second elastic part or between the first elastic part and second elastic part in the retainer as long as the engagement piece is positioned on the rear side of the second hold.

According to the present invention, if vibration, an impact or the like acts on the substrate held by the retainer and a force directed either leftwards or rightwards of the substrate is produced by displacement of the substrate, a pair of first elastic parts that support the second elastic part of the retainer individually deform to alleviate stress, whereby the first and second holds in the second elastic part keep up the contact positions with, and the contact state of, the substrate.

Effect of the Invention

The present invention is effective in preventing contamination and damage accompanying the turning of the substrate and alleviate impacts acting on the substrate to thereby eliminate the risk of the substrate from dislodging and being broken. Also, when the retainer is attached to the door of the substrate storage container, the present invention is effective in simplifying the operation of attaching the retainer-equipped door to the container body.

Further, when spring-like flexions are formed at least in either of the opposing parts or bridging parts of the frame, the retainer can be bent by a deforming operation at the flexions or the retainer can be restored to the original state by canceling the deforming operation at the flexions. Accordingly, it is possible to smoothly attach the retainer to the door or the like. Further, when positioning portions are formed at least in either of the opposing parts or bridging parts, it is possible to improve the precision of holding the substrate by the first and second holds.

When a unitary second elastic part is bridged between the free ends of a pair of first elastic parts, it is possible to reduce the number of parts and simplify the production process of the retainer compared to the case where a plurality of second elastic parts are used. Further, when the second hold is integrated with the outside end of the second elastic part, it is possible to enlarge the holding region of the substrate compared to the case where the second hold is integrated with a portion that is not the outside end.

When a pair of slopes in the first hold are formed asymmetrically with respect to the vertical and horizontal directions instead of being formed vertically symmetrically or horizontally symmetrically, the regions of the slopes forming the first hold that can be put in contact with the substrate can be made greater than that when the slopes are formed symmetrically with respect to the vertical and horizontal directions. It is therefore possible to positively accommodate the substrate within the holding groove even when the position of the substrate is being more or less deviated from the holding groove.

When a stopper is provided on the opposing surface of the door that opposes the substrate and this stopper is formed with an engagement groove defined by a pair of opposing wall faces that are inclined gradually coming closer to each other towards the bottom while an engagement piece that fits into the engagement groove of the stopper is formed on the rear side of the second hold of the retainer, it is possible to support the second hold of the second elastic part and prevent the substrate from dislodging from the holding groove.

Further, when a flexure-limiting rib that abuts the first elastic part before abutment between the bottom of the engagement groove and the engagement piece so as to limit excessive deformation of the first elastic part, is provided on the opposing surface of the door that opposes the substrate, the flexure-limiting rib abuts and repulsively supports the first elastic part even if a strong impact or the like acts on the substrate storage container, hence it is possible to alleviate the impact directly acting on the substrate. Further, since a sharp rise of the holding force on the substrate can be restrained, it is possible to expect efficient prevention against substrate's breakage, abrasion and the like.

Figure 1:
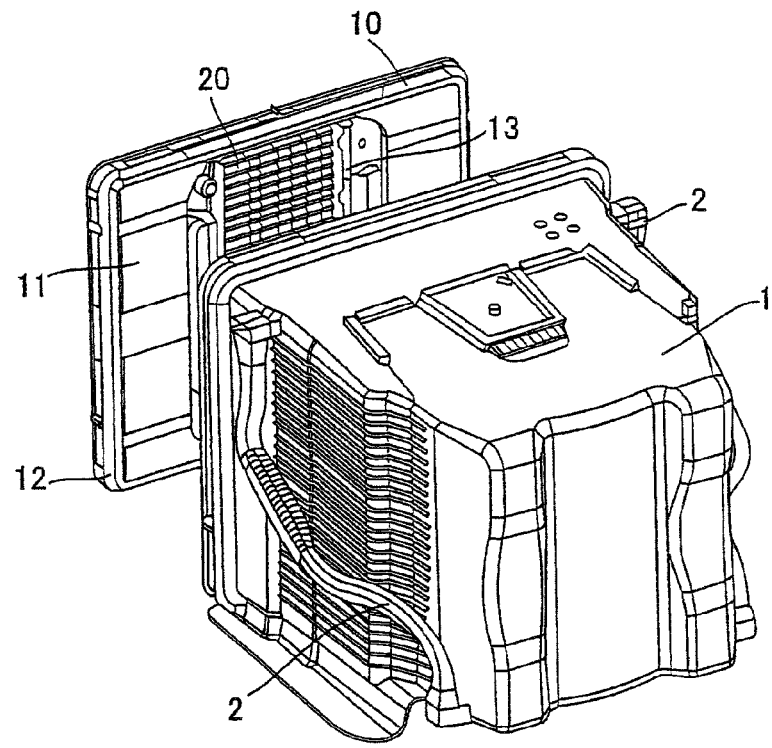
[FIG. 1] is an overall perspective illustration schematically showing the embodiment of a substrate storage container according to the present invention.

DESCRIPTION OF REFERENCE NUMERALS 1 container body
10 door
11 casing
13 backside central part
14 positioning projection
15 stopper
16 engaging claw
20 retainer
21 frame
22 opposing part
23 bridging part
24 positioning spot
25 flexion
26 rib
28 indentation and projection
29 first elastic part
30 free end
31 second elastic part
32 outside end
33 first hold
34 second hold
35 first hold forming region
36 second hold forming region
37 slope
38 holding groove
38a holding groove
38b holding groove
39 projection
40 fitting hole
41 boundary region
42 fixing projection
50 stopper rib (stopper)
50a stopper rib (stopper)
50b stopper rib (stopper)
51 engagement groove
52 wall surface
53 bottom
54 flexure-limiting rib
54a flexure-limiting rib
54b flexure-limiting rib
55 engagement piece
W semiconductor wafer (substrate)

BEST MODE FOR CARRYING OUT THE INVENTION

The preferred embodiment of the present invention will be described hereinbelow with reference to the drawings. A substrate storage container of the present embodiment includes, as shown in FIGS. 1 through 10, a container body 1 for storing a plurality of round semiconductor wafers W, a door 10 for opening and closing the open front of the container body 1 and a retainer 20 attached as a front retainer to the backside of door 10, the opposing side that opposes stored semiconductor wafers W to retain semiconductor wafers W. This retainer 20 has elastic structure projected from a frame 21 thereof. The elastic structure is separated into a plurality of first elastic parts 29 and a second elastic part 31, each first elastic part 29 being adapted to have a shock absorbing function.

A plurality of, for example, 25 or 26 semiconductor wafers W are stored in alignment inside container body 1. Each semiconductor wafer W is made of, for example, a thin monocrystalline silicon disc having a diameter of 300 mm with both the top and bottom sides mirror polished. A notch n having an approximately semielliptic shape when viewed from top is formed at the wafer's rim so as to facilitate alignment. This notch n is usually positioned on the open front side of container body 1. Formed along the periphery near the notch n is a barcode that is read by an unillustrated reader. The thus formed semiconductor wafer W is put into and taken from container body 1 by handling the wafer's rim at both sides using an unillustrated special robot.

Container body 1 and door 10 of the substrate storage container are formed by using a molding material such as, for example, polypropylene, cycloolefin polymer, polycarbonate, polyethylene terephthalate, polybutylene terephthalate, polyether etherketone, polyacetal, polyether imide and the like. Of these molding materials, polycarbonate that is excellent in transparency and high in rigidity is the best selection. These molding materials are selectively added with appropriate amounts of antistatic agents, electro conductive agents such as carbon, metal fibers, etc., ultraviolet absorbents and reinforcing agents such as glass fibers, carbon fibers etc.

As shown in FIG. 1, container body 1 is given in a front open box type having an opening on the front side to store a plurality of semiconductor wafers W arrayed vertically at intervals of a predetermined distance. On both the sides in the interior of this container body 1, pairs of left and right opposing teeth for horizontally supporting semiconductor wafers W are arranged vertically with a predetermined pitch.

Though not shown, each tooth includes a shelving plate integrally formed on the interior side part of container body 1 in an approximately rectangular shape, approximately open-V-shape or approximately semi-circular arc shape when viewed from top so as to go along the side periphery of semiconductor wafer W, and a flat substrate contact portion that is integrally formed on the shelving plate. In the shelving plate on the front side of container body 1, a step that regulates the position of semiconductor wafer W in cooperation with the interior wall surface of container body 1 is formed. The thus constructed plural pairs of teeth support the rims of semiconductor wafers W at both sides horizontally with high precision so as to provide a function of preventing trouble with the special robot in putting in and taking out semiconductor wafers W due to inclination from the horizon.

Integrally formed on the underside of container body 1 at both sides on the front side and the center on the rear are positioning devices (not shown) for positioning the substrate storage container on processing equipment (not shown). Each positioning device is given in a form having a section of an approximately M-shape, approximately V-shape, approximately Y-shape or the like. Further, a robotic flange (not shown) having an approximately rectangular shape when viewed from top, to be held by an uillustrated conveying mechanism (overhead hoist transfer), is removably attached at the center on the top of container body 1. Also, handles 2 for manual control that extend obliquely downwards from front to back, are provided on the walls on both sides of container body 1 between the top and bottom.

Figure 2:
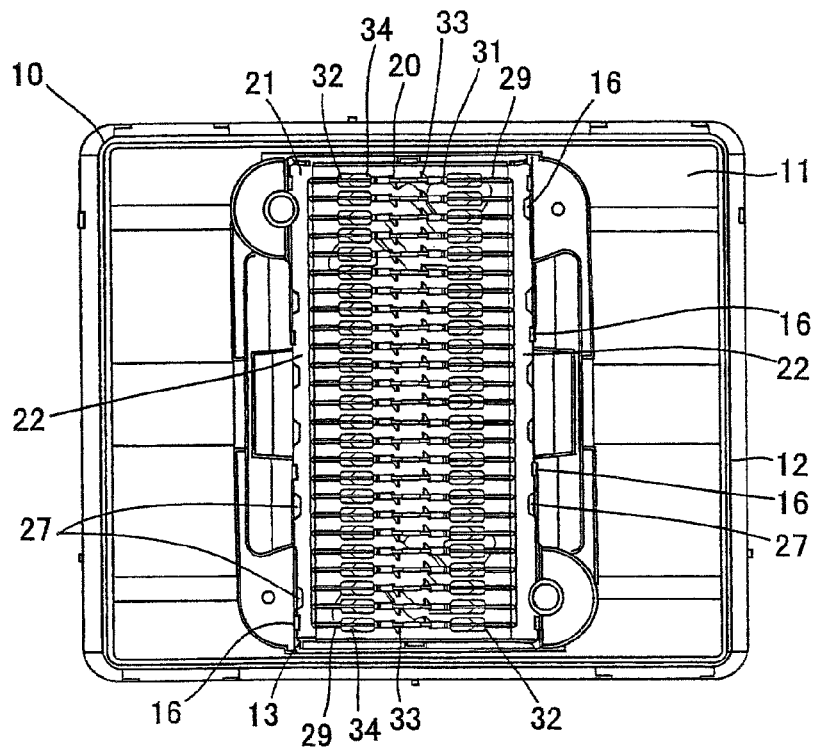
[FIG. 2] is an illustrative view schematically showing the backside of a door in the embodiment of a substrate storage container according to the present invention.

As shown in FIGS. 1 and 2, door 10 is comprised of a casing 11 having an approximately rectangular shape in a front view, corresponding to the front part of container body 1 and a pair of front plates that are exposed and attached at the left and right sides on the open surface of the casing 11, further incorporates a locking mechanism for locking up that can be operated by manipulation from the outside, between the casing 11 and the paired front plates, and is removably fitted to the front of container body 1 with a seal gasket 12 in-between, by means of door opening and closing equipment.

Casing 11 of door 10 basically has a form having an approximately dish-like section with endless seal gasket 12 on the peripheral side thereof while the central part on the front side having an approximately rectangular shape in a front view is formed swelling out. This swelling in the central part on the front defines sectioned spaces on both sides for incorporating the locking mechanism while a backside central part 13 is depressed in an approximately rectangular form to create a space for attachment of retainer 20 (see FIGS. 7 to 10).

Seal gasket 12 is formed in a frame-like shape using, for example, an elastic thermoplastic polyester elastomer and is compressed and deformed when door 10 is fitted, providing a sealing function. Further, though not illustrated, the locking mechanism is comprised of a pair of rotary plates that are axially supported at respective centers on both left and right areas on the front side of casing 11 and rotationally controlled from the outside, pairs of advancing and retracting plates that are coupled to each rotary plate and slides up and down as the rotary plate turns, and engaging claws which each are joined and pivotably supported at the distal end of each of the advancing and retracting plates to be engaged into an engaging hole bored on the inner peripheral side of the front part of container body 1, all these components being covered with the front plates of door 10.

A plurality of positioning projections 14 for positioning frame 21 of retainer 20 is provided in backside central part 13 that is depressed in casing 11 while a plurality of stoppers 15 that oppose first elastic parts 29 are projectively formed. Each stopper 15 functions to restrain excessive deformation and breakage of first elastic part 29 (see FIGS. 7 to 10). This stopper 15 may be given in an arbitrary form such as a cylindrical form, trapezoidal form or the like. Further, as shown in FIG. 2, a plurality of engaging claws 16 that detachably engage the frame 21 surface of retainer 20 are arranged vertically at both left and right sides of backside central part 13 of casing 11, each engaging claw 16 being bent and formed in a J-shape, L-shape or the like.

As shown in FIGS. 2 to 5, etc., retainer 20 includes vertically long frame 21 to be attached to door 10, a pair of first elastic parts 29 projected respectively from a pair of opposing parts 22 of the frame 21 and second elastic part 31 that is supported by bent free ends 30 of the paired first elastic parts 29 and extends in the circumferential direction of semiconductor wafer W to hold the wafer. This retainer is wet cleaned and dried together with door 10 or separately from door 10.

Retainer 20 is formed using a molding material such as, for example, synthetic resin including polypropylene, polycarbonate, polyethylene terephthalate, polybutylene terephthalate, polyether etherketone, polyacetal, polyether imide etc., thermoplastic polyester elastomers, thermoplastic polyurethane elastomers, and the like. Of these molding materials, polybutylene terephthalate that is less likely to outgas and be damaged during molding is the best selection. The molding material is selectively added with appropriate amounts of antistatic agents, electro conductive agents such as carbon, metal fibers, etc., ultraviolet absorbents and reinforcing agents such as glass fibers, carbon fibers etc.

Frame 21 of retainer 20 includes, as shown in FIGS. 2 to 5, 8 and others, a pair of opposing parts 22 that are extended in the vertical direction of door 10 and arranged left and right in parallel with and a distance apart from each other and a pair of bridging parts 23 that are horizontally supported at the top and bottom between the paired opposing parts 22. A positioning spot 24 that engages and holds positioning projection 14 of door 10 to improve the positioning accuracy is formed as a hollow at the backside midpoint of each opposing part 22. Each bridging part 23 is formed with a spring-like flexion 25 that is projected toward semiconductor wafer W. The retainer is detachably attached to depressed, backside central part 13 of door 10 by means of a plurality of engaging claws 16.

A rib 26 having an approximately I-shape in a front view, extending toward semiconductor wafers W and enabling holding and handling is projectively formed at each of the four corners on the frame 21 surface. These ribs 26 functions to improve attachment performance and effectively prevent first and second holds 33 and 34 from being deformed by a load when retainer 20 is stocked. The plural ribs 26 also provide a stacking function when a plurality of retainers 20 are piled up, or prevent first elastic parts 29, second elastic parts 31 from being deformed due to contingence. The height of each rib 26 is preferably designated so that first and second holds 33 and 34 of retainer 20 will be kept out of contact with those of other adjacent retainers 20 when a plurality of retainers 20 are stacked.

Figure 3:
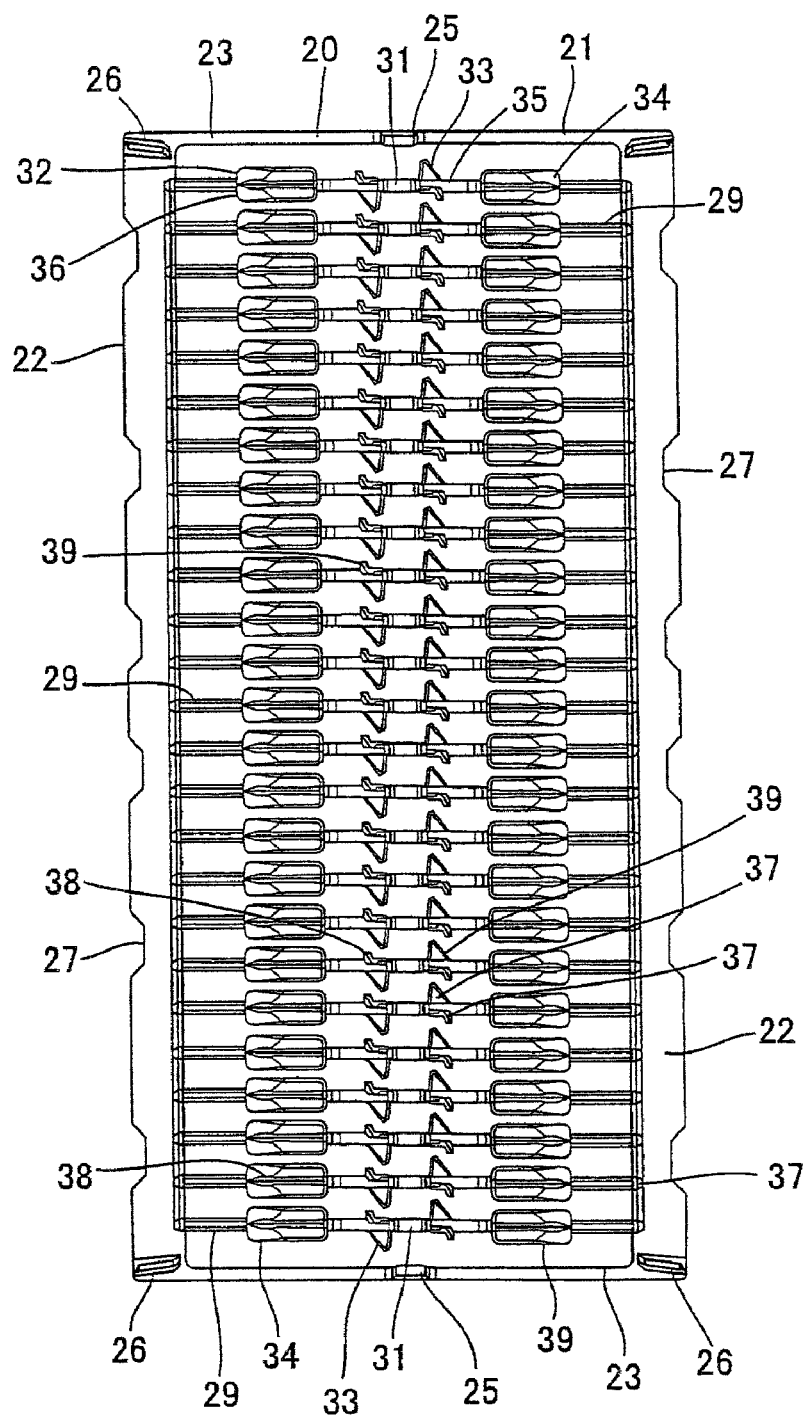
[FIG. 3] is a front illustrative view schematically showing the embodiment of a retainer according to the present invention.
Figure 4:
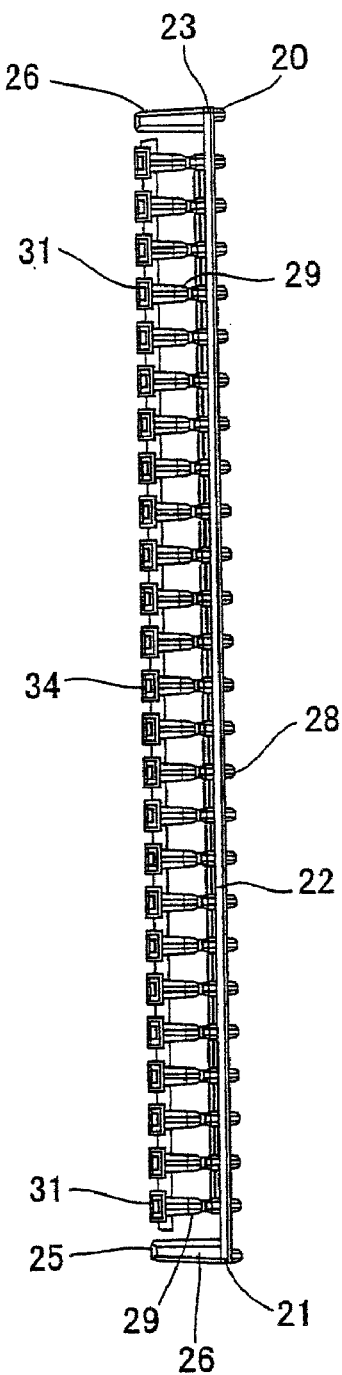
[FIG. 4] is a side illustrative view schematically showing the embodiment of a retainer according to the present invention.
Figure 8:
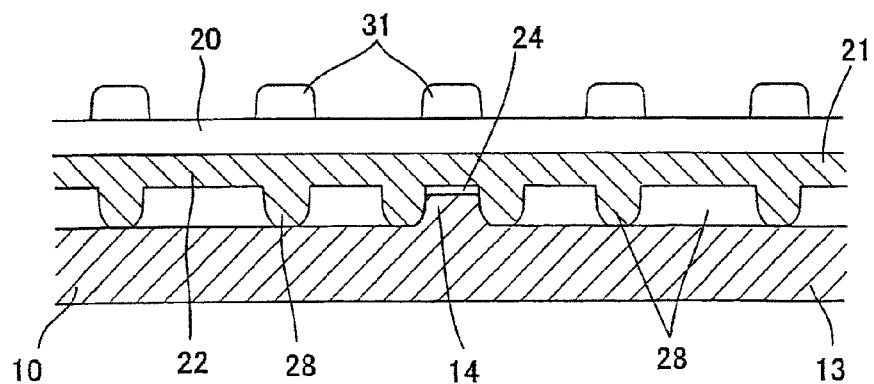
[FIG. 8] is a sectional illustrative view schematically showing the positioning condition of a door and a retainer in the embodiment of a substrate storage container according to the present invention being positioned.
Figure 9:
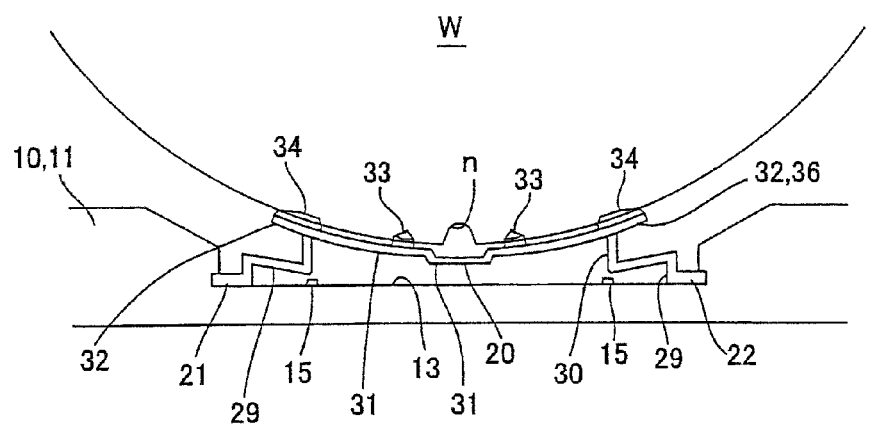
[FIG. 9] is an illustrative view schematically showing the storage state of a semiconductor wafer in the embodiment of a retainer and a substrate storage container according to the present invention.
Figure 10:
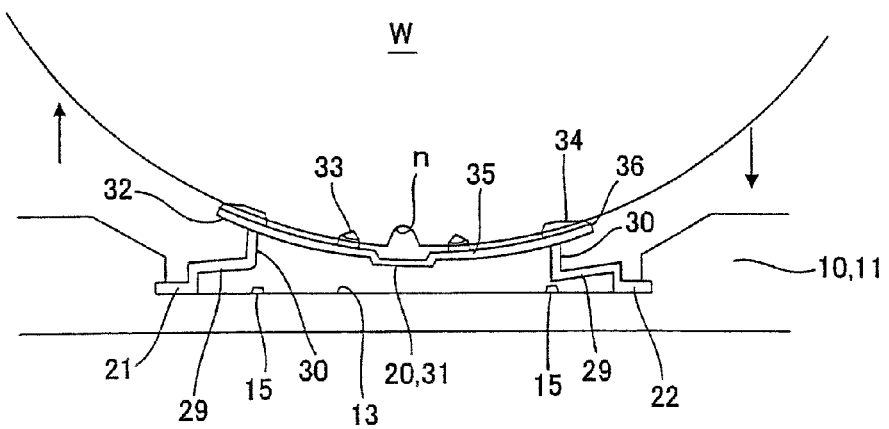
[FIG. 10] is an illustrative view schematically showing the embodiment of a retainer and a substrate storage container according to the present invention.

As shown in FIG. 3, a plurality of relief recesses 27 are formed and arranged apart from one another along the surface edge of each opposing part 22 to improve attachment and removal performance of retainer 20. Engaging claws 16 of casing 11 will detachably engage from the outside the regions other than where these plural relief recesses 27 are formed. Further, as shown in FIG. 8, a plurality of indentations and projections 28 are formed alternately at intervals along the longitudinal direction on the backside of each opposing part 22 that opposes door 10, so that these plural indentations and projections 28 improve drainability during cleansing and drying retainer 20.

Figure 5:
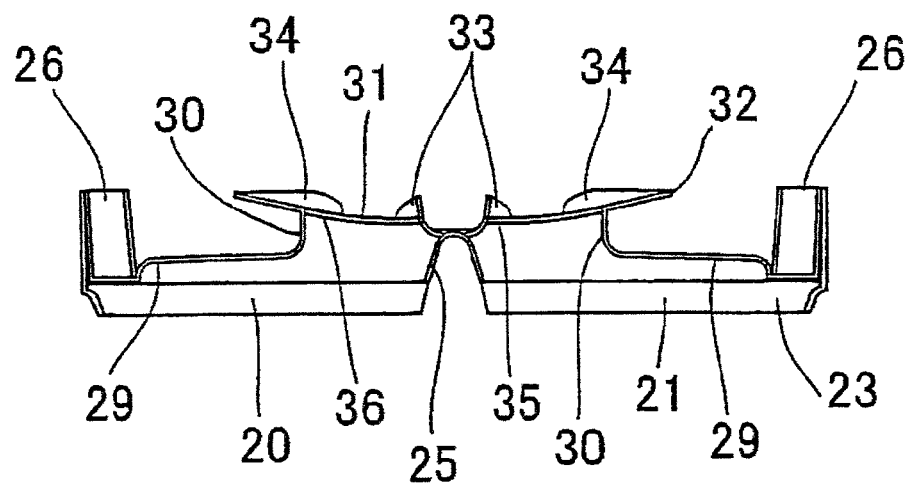
[FIG. 5] is an endface illustrative view schematically showing the embodiment of a retainer according to the present invention.
Figure 7:
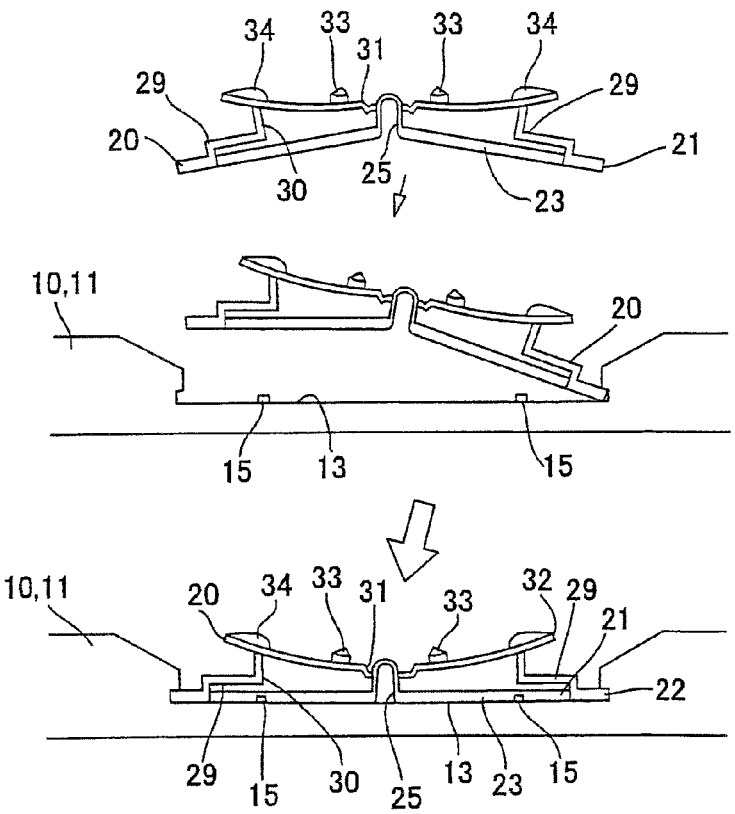
[FIG. 7] is an illustrative view schematically showing how attachment work is done in the embodiment of a retainer according to the present invention.

As shown in FIGS. 5 and 7, each flexion 25 is formed at the center of bridging part 23 so as to be curved in an approximately U-shape, and is deformed and narrowed by gripping so as to bend retainer 20 to form an approximately inverted open-V shaped section, whereby the attachment work for setting retainer 20 to the backside central part 13 of door 10 by means of engaging claws 16 can be made smooth.

Figure 6:
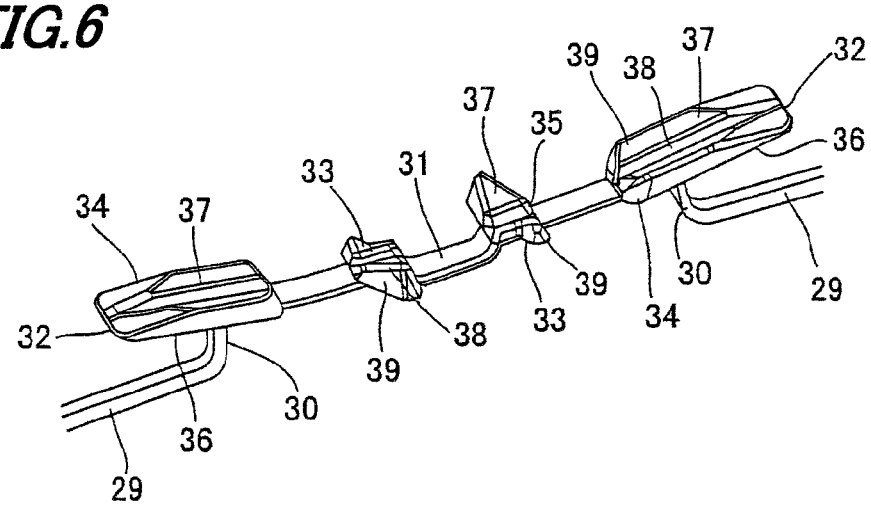
[FIG. 6] is a partial perspective illustration schematically showing the embodiment of a retainer according to the present invention.

As shown in FIGS. 5 to 7 and other, a pair of first elastic parts 29 are projected inwards respectively from paired opposing parts 22 of frame 21 so as to extend close each other leaving a spacing. Plural pairs of the elastic parts are arrayed vertically in the longitudinal direction of frame 21 with a predetermined pitch. As shown in FIGS. 5 to 7 and others, each first elastic part 29 is bent in an elongated, approximately L-shape so as to be deformable following the movement of semiconductor wafer W and arranged parallel to bridging parts 23 of frame 21 with short-side free end 30 directed toward semiconductor wafer W and the backside of the bend positioned opposing, and apart from, stopper 15 of door 10.

As shown in FIGS. 5 to 7 and others, second elastic part 31 is formed as a slightly curved plate-like strip so as to fit along the front rim of semiconductor wafer W with the central part slightly depressed in an approximately U-shape toward first elastic parts 29. This second elastic part 31 is supported between bent free ends 30 of a pair of first elastic parts 29 and arranged parallel to bridging parts 23 of frame 21 and first elastic parts 29 with its outer ends 32 positioned outside, and closer to, respective opposing parts 22 of frame 21 than free ends 30 of first elastic parts 29, and retains semiconductor wafer W by first and second holds 33 and 34.

Describing first and second holds 33 and 34 shown in the same drawings, a pair of left and right first holds 33 are integrally formed at positions located slightly away to the left and right from the center of second elastic part 31, or in first hold forming regions 35 while a pair of left and right second holds 34 are integrally formed at both outside ends 32 of second elastic part 31, or in second hold forming regions 36; second holds 34 are located closer to the outside end 32 sides of second elastic part 31 than first holds 33 are.

As shown in FIGS. 2 and 5 to 7, first and second holds 33 and 34 each include a projection 39 that has a holding groove 38 formed with a pair of opposing slopes 37, tapering toward the bottom or having an approximately V-shaped or approximately Y-shaped section. The rim on the front side of semiconductor wafer W is guided into holding groove 38 of the projection 39 and positioned and held therebetween.

As shown in FIGS. 5 to 7, 9 and others, a pair of first holds 33 abut semiconductor wafer W earlier than second holds 34, near the center line thereof placing the notch n of semiconductor wafer W in-between and provide a guiding function of adjusting the position of semiconductor wafer W by slopes 37 and guiding the wafer to holding groove 38 of projection 39.

First hold 33 is constructed such that a pair of slopes 37 of approximately block-shaped projection 39 are formed asymmetrically with respect to the vertical and horizontal directions and this pair of slopes 37 are formed higher than the pair of slopes 37 in second hold 34. Specifically, the pair of slopes 37 of this projection 39 are formed such that one is higher and the other is lower in view of positively guiding semiconductor wafer W into holding groove 38. Further, the left and right holds are formed asymmetrical with respect to the center line of the plane of semiconductor wafer W.

As shown in FIGS. 5 to 7, 9 and others, in view of stably holding semiconductor wafer W that has been set in alignment at the predetermined position by first holds 33, each second hold 34 is constructed such that projection 39 and its holding groove 38 are extended in the circumferential direction of semiconductor wafer W. The height of this second hold 34 is adjusted so that the second hold does not jut out from the backside of door 10.

In the above configuration, when door 10 with retainer 20 is going to be fitted to the open front of container body 1 that is storing a plurality of semiconductor wafers W in alignment, the rim of each semiconductor wafer W at the front comes into contact with first holds 33 first, then, from this state retainer 20, as adjusting the position of the semiconductor wafer W along slopes 37, approaches along the center line of semiconductor wafer W, so that slopes 37 of second holds 34 abut semiconductor wafer W. In this state, the semiconductor wafer W is held in holding grooves 38 of first and second holds 33 and 34.

In the state where door 10 is completely fitted to the open front of container body 1, second elastic part 31 having first and second holds 33 and 34 moves parallel along the shape of semiconductor wafer W on the center line of semiconductor wafer W to hold semiconductor wafer W. In this case, each first elastic part 29 deforms in the direction of door 10's thickness, and the repulsive force accompanying this deformation is transferred to second elastic part 31, so that semiconductor wafer W is firmly retained.

Next, description will be made referring to a case where vibration and/or impacts act on semiconductor wafers W during transportation of the substrate storage container, causing slippage of semiconductor wafers W. In this case, a force acts on semiconductor wafer W in either left or right direction (see arrows in FIG. 10). At this moment, paired first elastic parts 29 that support second elastic part 31 individually deform asymmetrically so as to relieve stress, so that first and second holds 33 and 34 can be kept in contact with semiconductor wafer W. As a result, it is possible to effectively prevent semiconductor wafer W from dislodging from holding groove 38 of first and second holds 33 and 34 and from rotating.

According to the above configuration, since the elastic structure of retainer 20 is divided into first elastic parts 29 and second elastic part 31 so that first elastic parts 29 alone are deformed while first and second holds 33 and 34 in second elastic part 31 will not change their relative positions to semiconductor wafer W, it is possible to enlarge the holding range of semiconductor wafer W and continuously retain semiconductor wafer W in a stable manner. Accordingly, it is possible to restrain semiconductor wafer W's rotation, hence there is no fear of first and second holds 33 and 34 being abraded to produce particles, semiconductor wafer W being contaminated and its surface being damaged, which would occur accompanying semiconductor wafer W's rotation.

Further, it is no longer necessary to restrain semiconductor wafer W's rotation by enhancing the holding force of first and second holds 33 and 34, so that no large resistance will occur when door 10 is fitted to the front of container body 1. As a result, it is possible to smoothly fit door 10 to container body 1. Further, since a plurality of relief recesses 27 are formed and arranged along the surface edge of opposing parts 22 of frame 21, simplification and facilitation of the removing work of mounted retainer 20 can be greatly expected if the gripping operation is made by making use of the relief recesses 27.

Moreover, since a pair of first holds 33 are formed apart from each other between second holds 34, visual check and reading work of the barcode on semiconductor wafer W will never be hindered. Further, since a plurality of indentations and projections 28 are formed in the longitudinal direction on the opposing parts 22's backside that opposes door 10, it is possible to restrain deformation by alleviating molding shrinkage at the time of forming retainer 20. Accordingly, it is possible to markedly improve the precision of contact between semiconductor wafer W and first and second holds 33 and 34.

Figure 11:
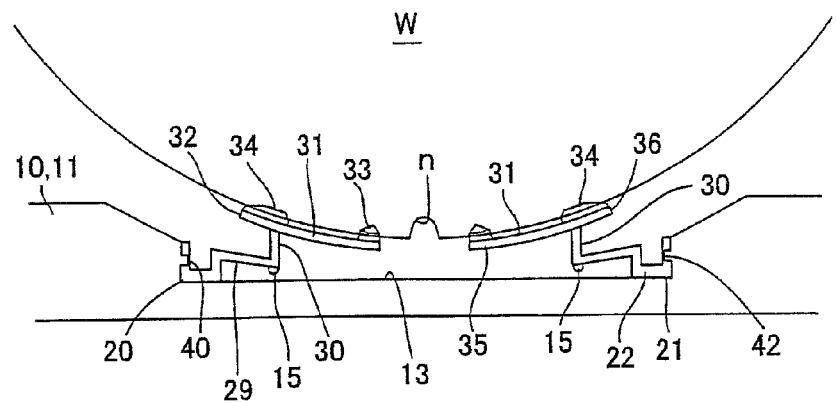
[FIG. 11] is an illustrative view schematically showing the second embodiment of a retainer and a substrate storage container according to the present invention.

Next, FIG. 11 shows the second embodiment of the present invention. In this case, a pair of second elastic parts 31 are supported at respective bent free ends 30 of a pair of first elastic parts 29 with the inner ends of second elastic parts 31 arranged apart from, but close to, each other. Each second elastic part 31 is curved so as to fit along the rim on the front side of semiconductor wafer W.

Formed at intervals around depressed backside central part 13 of door 10 are a plurality of fixing projections 42 for fixing frame 21 of retainer 20. A plurality of fitting holes 40 for positioning to be fitted to respective fixing projections 42 are formed at intervals on the outer peripheral side of frame 21 of retainer 20. A stopper 15 for limiting excessive deformation of first elastic part 29 is projectively formed on the backside of a flexion 25 of each first elastic part 29. Further, a first hold 33 is integrally formed at the inner end of each second elastic part 31 while a second hold 34 is integrally formed at an outer end 32 of each second elastic part 31. Other components are the same as those in the above embodiment, so that description is omitted.

Also in the present embodiment, the same operation and effect as in the above embodiment can be expected, and it is still obvious that the variety of frame 21, first elastic part 29 and second elastic part 31 of retainer 20 can be added.

Figure 12:
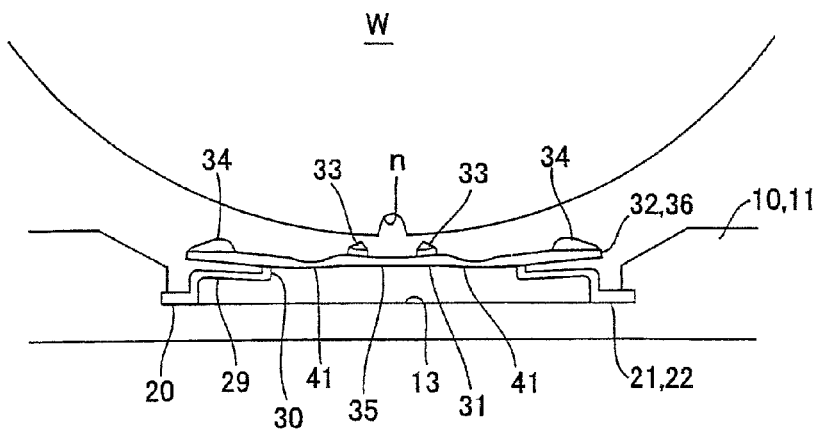
[FIG. 12] is an illustrative view schematically showing the third embodiment of a retainer and a substrate storage container according to the present invention.
Figure 13:
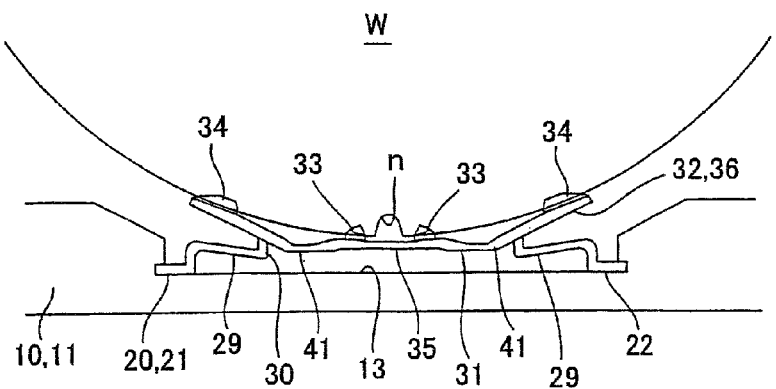
[FIG. 13] is an illustrative view schematically showing the storage state of a semiconductor wafer in the third embodiment of a retainer and a substrate storage container according to the present invention.

Next, FIGS. 12 and 13 show the third embodiment of the present invention. In this case, each second elastic part 31 is arranged parallel to first elastic parts 29 and constructed such that first and second hold forming regions 35 and 36 in this second elastic part 31 are formed to be thick while boundary regions 41 between first and second hold forming regions 35 and 36 are formed as thin portions, so that the thin portions of boundary regions 41 will serve as the inflexion points to bend second hold 34 and second hold forming regions 36 along the rim on the front side of semiconductor wafer W.

In the above configuration, first holds 33 fit on the rim on the front side of semiconductor wafer W, then retainer 20 from this state moves closer along the center line of semiconductor wafer W, thereby each first elastic part 29 deforms in the direction of door 10's thickness. When the rim on the front side of semiconductor wafer W comes into contact with first holds 33 of retainer 20, the central part of second elastic part 31 is pressed and displaced by semiconductor wafer W. With this displacement, second holds 34 of second elastic part 31 bend at the inflexion points in the thin portions along the rim on the front side of semiconductor wafer W, so as to appropriately hold the rim on the front side of semiconductor wafer W.

In this condition, first and second hold forming regions 35 and 36 in second elastic part 31 form approximately obtuse angles as shown in FIG. 13. Other components are the same as those in the above embodiment, so that description is omitted.

Also in the present embodiment, the same operation and effect as in the above embodiment can be expected, and it is still obvious that the variety of frame 21, first elastic part 29 and second elastic part 31 of retainer 20 can be added.

Next, FIGS. 14 to 19 show the fourth embodiment of the present invention. In this case, a plurality of stopper ribs 50 and flexure-limiting ribs 54 are provided in a backside central part 13 of a casing 11 that constitutes a door 10 while each of first elastic parts 29 of retainer 20 is integrally formed with an engagement piece 55 that engages stopper rib 50 so as to exclude harmful effects due to action of external force on the substrate storage container.

Figure 14:
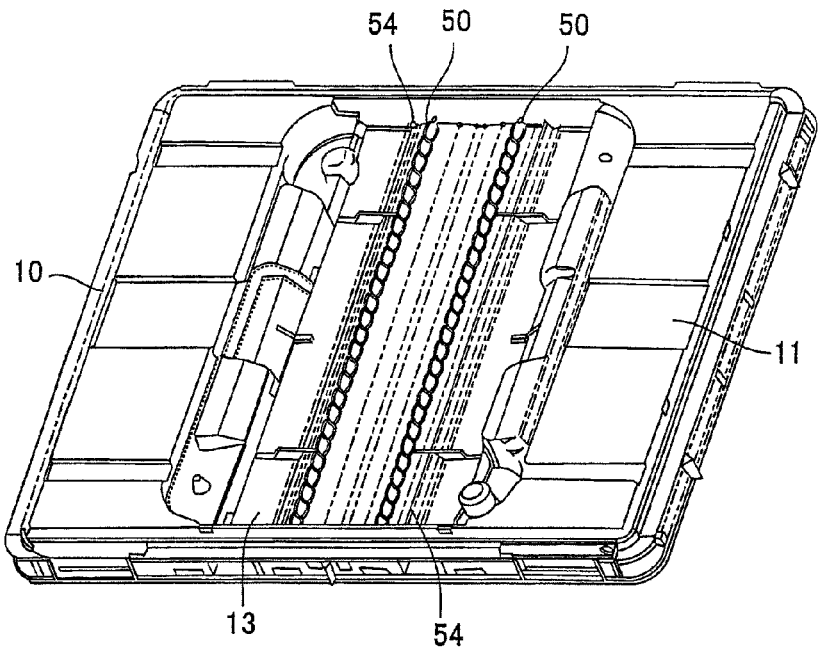
[FIG. 14] is a perspective illustrative view schematically showing a door in the fourth embodiment of a retainer and a substrate storage container according to the present invention.
Figure 15:
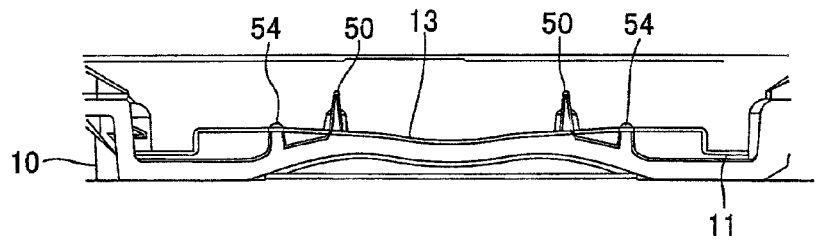
[FIG. 15] is an illustrative view schematically showing the backside central part of a door in the fourth embodiment of a retainer and a substrate storage container according to the present invention.
Figure 16:
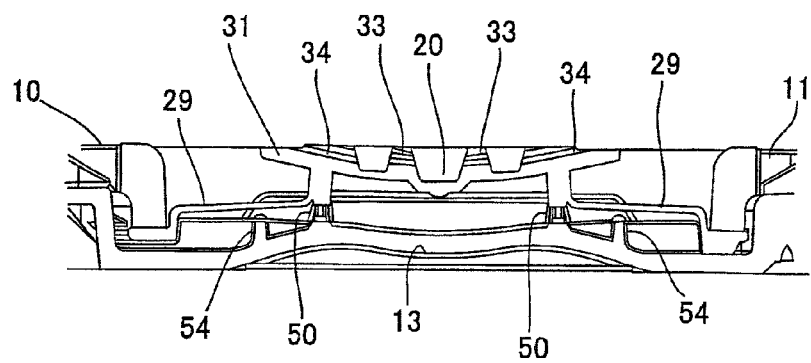
[FIG. 16] is an illustrative view schematically showing the relationship between the backside central part of a door and a retainer in the fourth embodiment of a retainer and a substrate storage container according to the present invention.
Figure 17:
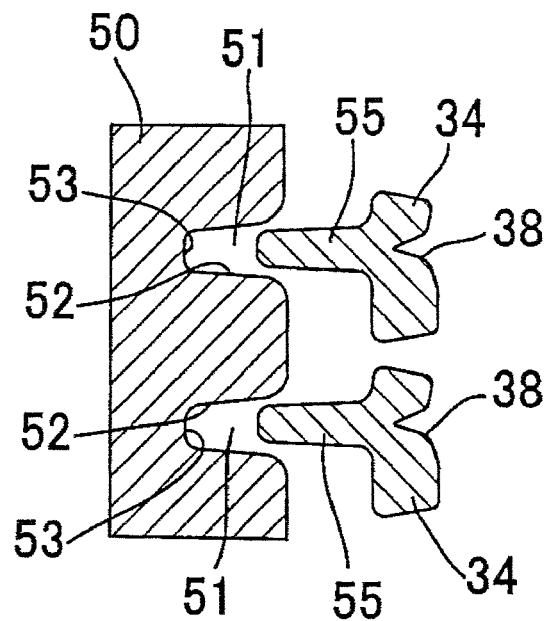
[FIG. 17] is a sectional illustrative view schematically showing the state where an engaging piece starts fitting with a stopper rib in the fourth embodiment of a retainer and a substrate storage container according to the present invention.
Figure 18:
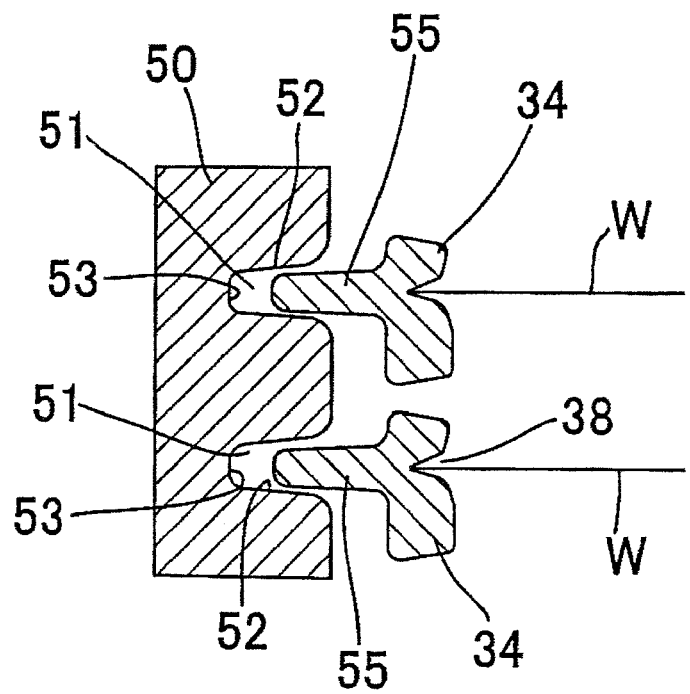
[FIG. 18] is a sectional illustrative view schematically showing the state where an engaging piece is going to be engaged with a stopper rib in the fourth embodiment of a retainer and a substrate storage container according to the present invention.
Figure 19:
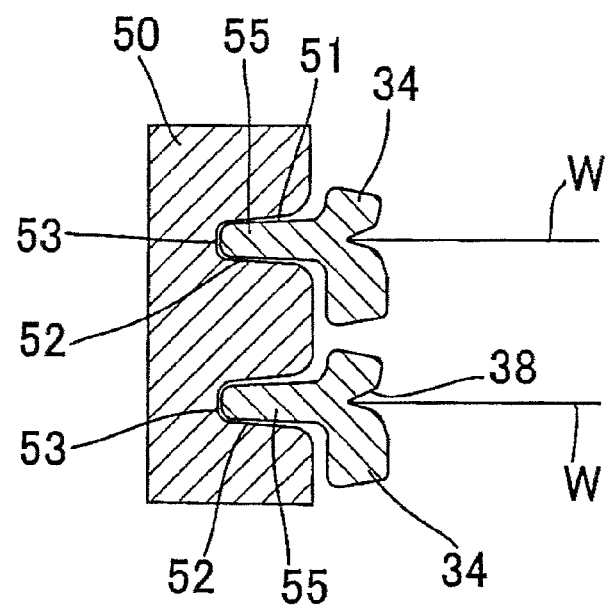
[FIG. 19] is a sectional illustrative view schematically showing the state where an engaging piece has engaged with a stopper rib in the fourth embodiment of a retainer and a substrate storage container according to the present invention.

As shown in FIGS. 15 and 16, the depressed backside central part 13 of casing 11 is not given as a flat plane but is curved with rise and fall in the direction of door 10's thickness, forming an approximately wavy section. This provides a function of reinforcing door 10 so as to resist the holding force of semiconductor wafers W and prevent the door from being deformed. Further, as to the plural stopper ribs 50, a pair of left and right stopper ribs 50 are arranged apart from each other at positions close to the center in backside central part 13 of casing 11, and plural pairs of stopper ribs 50 are laid out in the vertical direction of casing 11, as shown in FIGS. 14 to 16.

As shown in FIGS. 15 to 19, each stopper rib 50 is projectively formed from the backside central part 13 of casing 11 toward retainer 20 (upwards in FIG. 15) with its surface hollowed with an engagement groove 51 that engages engagement piece 55. The opposing wall surfaces 52 in this engagement groove 51 are obliquely formed so as to gradually come closer to each other from the opening side to the bottom 53, or toward the backside of casing 11. The thus formed stopper rib 50 functions to support second hold 34 of second elastic part 31 by engagement between engagement groove 51 and engagement piece 55 and prevent semiconductor wafer W from falling out from holding groove 38.

As shown in FIGS. 14 to 16, a pair of left and right flexure-limiting ribs 54 are arranged apart from each other in backside central part 13 of casing 11, and the flexure-limiting ribs 54 are arranged parallel to stopper ribs 50 and outside stopper ribs 50. In other words, the flexure-limiting ribs are positioned closer to left and right sides of backside central portion 13 of casing 11. This flexure-limiting rib 54 is formed closer to retainer 20 than bottom 53 of engagement groove 51 so that the rib abuts first elastic part 29 before abutment between bottom 53 of engagement groove 51 and engagement piece 55.

The thus constructed flexure-limiting rib 54 abuts first elastic part 29 before contact of stopper rib 50 so as to limit excessive flexure of the first elastic part, thus providing a function of preventing strong direct impacts from acting on semiconductor wafer W when stopper rib 50 abuts first elastic part 29.

As shown in FIGS. 16 to 19, each engagement piece 55 is projectively formed plate-like near the bend of first elastic part 29 and located on the rear side of second hold 34 and keeps, as it is being guided by inclined opposing wall surfaces 52 of engagement groove 51, the position of semiconductor wafer W within a predetermined range without being affected by vibration and impacts. Since other components are the same as those in the above embodiment, description is omitted.

Also in the present embodiment, the same operation and effect as in the above embodiment can be expected. Further, since flexure-limiting rib 54 abuts and repulsively supports first elastic part 29 if a large impact acts on the substrate storage container, it is possible to markedly reduce the direct action of the impact on semiconductor wafer W. Further, since it is possible to restrain sharp rise of the retaining force on semiconductor wafer W if a strong force acts, it is obvious that effective prevention against breakage and abrasion of semiconductor wafer W can be expected.

Though in the above embodiments, semiconductor wafers W having a diameter of 300 mm were shown, the semiconductor wafers W should not be limited to this but may include semiconductor wafers W having diameters of 200 mm and 450 mm. Further, the teeth were integrally formed on both sides of the interior of container body 1, but separate teeth may be attached afterwards to both interior sides of container body 1 using fixture parts, friction engagement and the like. Further, a necessary number of ribs 26 having an approximately L-shape in a front view may be projectively formed on the frame 21 surface. Also, a plurality of indentations and projections 28 may be formed on the bridging part 23's backside that opposes door 10. Flexion 25 may also be formed in an approximately C-shape, approximately V-shape, or the like.

Further, bridging part 23 may be curved as a whole in an arc shape so as to form a spring flexion 25. Also, a spring flexion 25 may be formed with an opposing part 22, instead of bridging part 23. It is also possible to improve the directivity when retainer 20 is attached by arranging positioning projections 14 and/or positioning spots 24 symmetrically or asymmetrically.

It is also possible to arrange positioning projections 14 and positioning spots 24 symmetrically, and newly add to frame 21, indentations and projections or the like that represent the vertical directivity. Further, it is possible to form a hollow as positioning spot 24 in the backside central part 13 of door 10 and a positioning projection 14 in opposing part 22 of frame 21. First elastic part 29 may be formed in a J-shaped, S-shape, Z-shape or other forms.

It is also possible to adjust the spring force of first elastic part 29 by adjusting the distance between stopper rib 50 and flexure-limiting rib 54 and/or the height of flexure-limiting rib 54. It is also possible to adjust the distance between stopper rib 50 and flexure-limiting rib 54 based on the position at which semiconductor wafer W is held.

Figure 20:
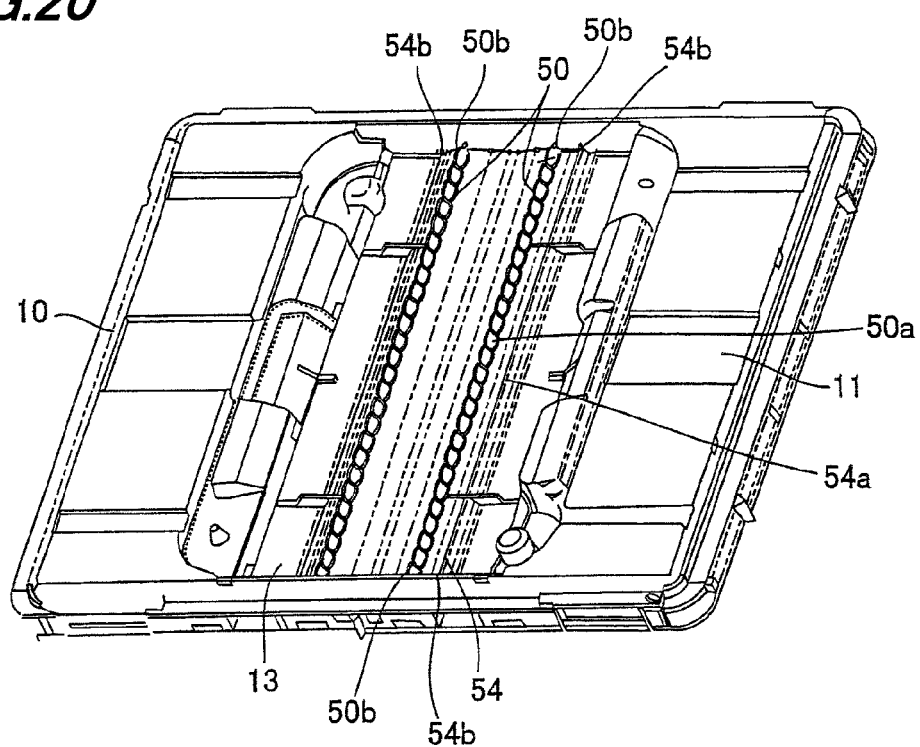
[FIG. 20] is a perspective illustrative view schematically showing a door in another embodiment of a retainer and a substrate storage container according to the present invention.

Further, as shown in FIG. 20, when the semiconductor wafer W's holding position is located in the middle part of door 10, the stopper ribs 50a and flexure-limiting ribs 54a are easily influenced by deformation of door 10, hence may be formed higher than the stopper ribs 50b and flexure-limiting ribs 54b which are located at both ends and hence less deformed due to the locking mechanism of door 10. Further, as to the holding force on semiconductor wafer W, it is preferable to make the holding force on semiconductor wafer W uniform without regarding to the holding position of semiconductor wafer W by reducing the distance between stopper rib 50 and flexure-limiting rib 54.

Figure 21:
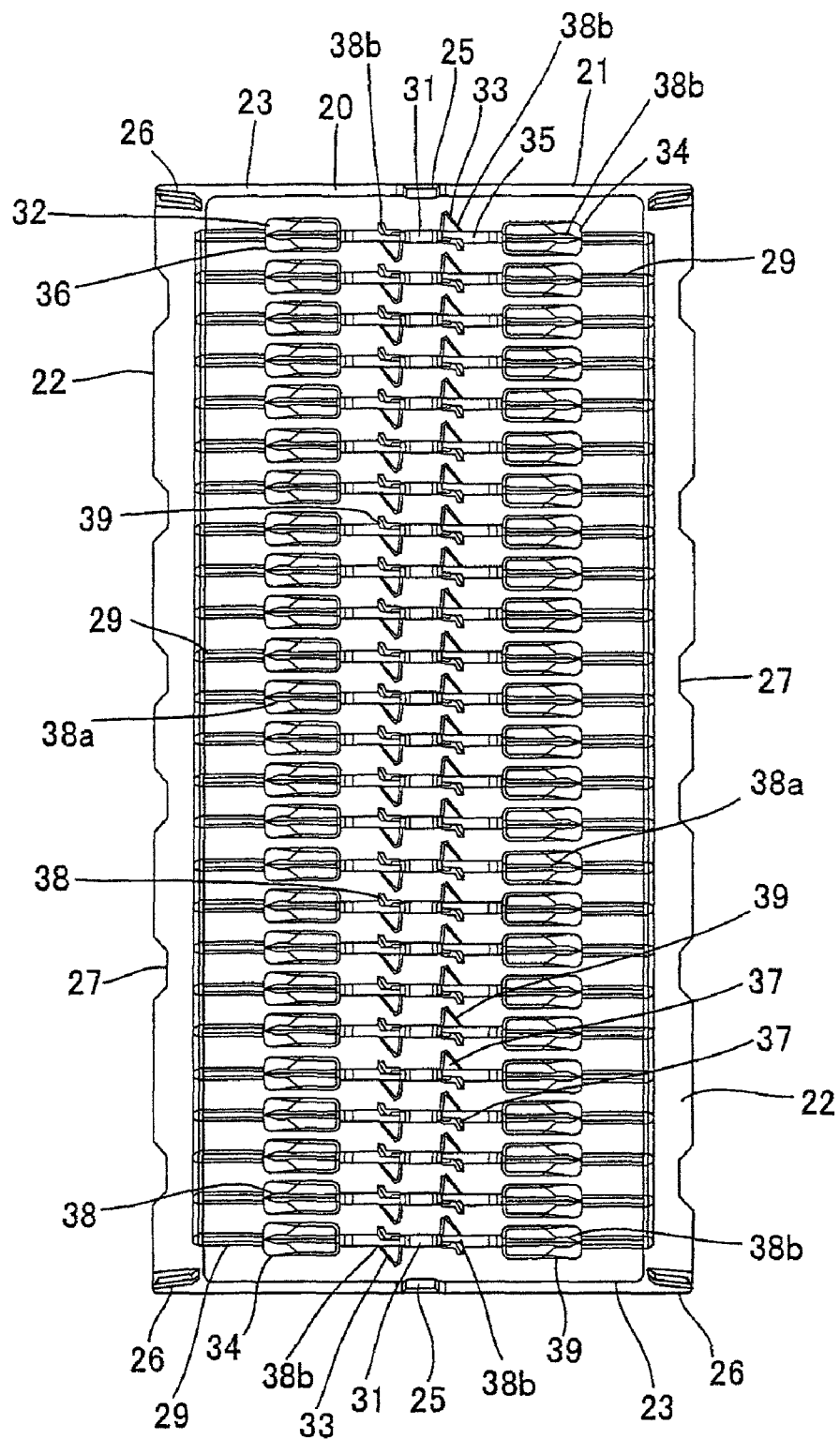
[FIG. 21] is a front illustrative view schematically showing another embodiment of a retainer according to the present invention.

Similarly to the above, the distance to the contact points of holding grooves 38a with semiconductor wafer W in the first and second holds 33 and 34 which are located to hold semiconductor wafer W in the middle part of door 10 and hence easily influenced by deformation of door 10, may be configured to be shorter than the distance to the contact points of holding grooves 38b in the first and second holds 33 and 34 which are located at both ends and hence less deformed due to the locking mechanism of door 10 (see FIG. 21).

In particular, it is preferred that the distance to the contact points of holding grooves 38 in the first and second holds 33 and 34 is designed so as to be gradually decreased from the middle position for holding semiconductor wafer W toward both ends. In this case, when the distances to the contact points of holding grooves 38 with semiconductor wafer W in the first and second holds 33 and 34 are connected from the both ends to the middle position, the points go curvedly or linearly forming a convex-lens like (barrel-like) form.

Alternatively, first elastic part 29 may be formed with a projected flexure-limiting rib 54 for limiting excessive deformation of the first elastic part so that the rib will abut the door 10's backside central part 13 before fitting of engagement piece 55 to bottom 53 of engagement groove 51. With this configuration, even if a strong impact acts on the substrate storage container, flexure-limiting rib 54 abuts and repulsively supports backside central part 13. Hence it is possible to markedly reduce the direct impact acting on semiconductor wafer W. Further, since it is possible to restrain sharp rise of the retaining force on semiconductor wafer W if a strong force acts, it is possible to efficiently prevent semiconductor wafer W from being broken or abraded.

The invention claimed is:

1. A retainer comprising:
   a frame comprising a pair of opposing parts that are opposed to each other, and a bridging part that bridges the pair of opposing parts;
   a pair of first elastic parts, which are projected from one and the other of the pair of opposing parts of the frame, respectively, wherein free ends of the pair of first elastic parts are directable toward a substrate, the pair of first elastic parts being bent in an elongated, approximate L-shape, and are formed to be arranged substantially parallel to the bridging part;
   a second elastic part that bridges the free ends of the first elastic parts, wherein the second elastic part extends along a periphery of the substrate, thereby retaining the substrate;
   a pair of first holds arranged on the second elastic part so as to hold a rim of the substrate; and
   a pair of second holds, which are arranged at one and the other ends of the second elastic part, respectively, so as to hold a rim of the substrate,
   wherein the second elastic part is configured to be movable in a direction, which the second elastic part extends toward, due to movement of the substrate held by the second elastic part;
   wherein the second elastic part is configured such that an outer end of the second elastic part is disposed on an outer side of the free ends of the pair of first elastic parts;
   wherein each of the first holds is formed at a center-line side of the substrate while the second holds are formed on an outer-side edge of the second elastic part, respectively, with a space in-between, such that the first holds abuts the substrate earlier than the second holds so as to hold the substrate;
   wherein the second elastic part is formed so as to be supported between the free ends of the pair of first elastic parts and the other ends thereof are arranged to be positioned outside, and close to, the respective opposing parts than the free end, and a middle portion of the second elastic part is supported by the free ends;

wherein two projections are formed at each of the first holds such that one is higher and the other is lower, and are formed asymmetrically with respect to the center line of the plane of semiconductor wafer; and wherein a projection and a holding groove are formed at each of the second holds such that the projection and holding groove are extended in the circumferential direction of the semiconductor wafer and are formed to be arranged on both outer ends to be positioned outside, and close to, the respective opposing parts than the free end of the first elastic part; and wherein the frame includes the pair of opposing parts arranged apart from, each other and a pair of second bridging parts supported at both ends between the paired opposing parts, and at least spring-like flexions and positioning portions are formed at least in either of the opposing parts or the bridging parts.

2. The retainer according to claim 1, wherein the second elastic part is supported between the free ends of the paired first elastic parts, and one of the second holds is integrated with an outside end of the second elastic part.

3. The retainer according to claim 1, wherein first hold forming regions and second hold forming regions in the second elastic part are formed to be thicker than boundary regions between the first and second hold forming regions, so that the boundary regions serve as inflexion points to bend the second hold forming regions in the circumferential direction of the substrate.

4. The retainer according to claim 1, wherein the second elastic part is supported on respective free ends of the paired first elastic parts with the inner ends of the second elastic part arranged apart from, and close to, each other, and the second elastic part is curved so as to fit along the rim of the substrate, one of the second holds being integrated with an outside end of the second elastic part.

5. The retainer according to claim 1, wherein the first and second holds each include a projection with a holding groove having an approximately V-shaped or approximately Y-shaped section defined by a pair of slopes, and the paired slopes in the first hold are formed asymmetrically with respect to the vertical and horizontal directions and formed higher than the pair of slopes in the second hold.

6. A substrate storage container comprising:
an opening of a container body for storing a substrate opened and closed by a removable door, and a retainer, wherein the retainer comprises:
a frame comprising a pair of opposing parts that are opposed to each other, and a bridging part that bridges the pair of opposing parts;
a pair of first elastic parts, which are projected from one and the other of the pair of opposing parts of the frame, respectively, wherein free ends of the pair of first elastic parts are directed toward the substrate, the pair of first elastic parts being bent in an elongated, approximate L-shape, and arranged substantially parallel to the bridging part;
a second elastic part that bridges the free ends of the first elastic parts, wherein the second elastic part extends along a periphery of the substrate, thereby retaining the substrate;
a pair of first holds arranged on the second elastic part so as to hold a rim of the substrate; and
a pair of second holds, which are arranged at one and the other ends of the second elastic part, respectively, so as to hold a rim of the substrate,
wherein the second elastic part is configured to be movable in a direction, which the second elastic part extends toward, due to movement of the substrate held by the second elastic part;

wherein the second elastic part is configured such that an outer end of the second elastic part is disposed on an outer side of the free ends of the pair of first elastic parts;

wherein each of the first holds is formed at a center-line side of the substrate while the second holds are formed on an outer-side edge of the second elastic part, respectively, with a space in-between, such that the first holds abuts the substrate earlier than the second holds so as to hold the substrate;

wherein the second elastic part is formed so as to be supported between the free ends of the pair of first elastic parts and the other ends thereof are arranged to be positioned outside, and close to, the respective opposing parts than the free end, and a middle portion of the second elastic part is supported by the free ends;

wherein two projections are formed at each of the first holds such that one is higher and the other is lower, and are formed asymmetrically with respect to the center line of the plane of semiconductor wafer; and wherein a projection and a holding groove are formed at each of the second holds such that the projection and holding groove are extended in the circumferential direction of the semiconductor wafer and arranged on both outer ends to be positioned outside, and close to, the respective opposing parts than the free end of the first elastic part; and wherein the frame includes the pair of opposing parts arranged apart from, each other and a pair of second bridging parts supported at both ends between the paired opposing parts, and at least spring-like flexions and positioning portions are formed at least in either of the opposing parts or the bridging parts;

wherein the retainer is attached to an opposing surface of the door that opposes the substrate.

7. The substrate storage container according to claim 6, wherein a stopper for limiting excessive deformation of the first elastic part is provided on the opposing surface of the door and the first elastic part of the retainer.

8. The substrate storage container according to claim 6, wherein first and second hold forming regions in the second elastic part form approximately obtuse angles when the first holds of the retainer and the circumferential edge of the substrate come into contact.

9. The substrate storage container according to claim 6, wherein a stopper is provided on the opposing surface of the door that opposes the substrate, the stopper is formed with an engagement groove defined by a pair of opposing wall faces that are inclined gradually coming closer to each other towards a bottom of the engagement groove while an engagement piece that fits into the engagement groove of the stopper is formed on a backside of the second hold of the retainer.

10. The substrate storage container according to claim 9, wherein a flexure-limiting rib that abuts the first elastic part before abutment between the bottom of the engagement groove and the engagement piece so as to limit excessive deformation of the first elastic part is provided on the opposing surface of the door that opposes the substrate.

11. The substrate storage container according to claim 9, wherein a flexure-limiting rib that abuts the opposing surface of the door that opposes the substrate before abutment between the bottom of the engagement groove and the engagement piece to limit excessive deformation of the first elastic part is provided for the first elastic part.

* * * * *

UNITED STATES PATENT AND TRADEMARK OFFICE
CERTIFICATE OF CORRECTION

| | | |
|---|---|---|
| PATENT NO. | : 8,356,713 B2 | Page 1 of 1 |
| APPLICATION NO. | : 12/741168 | |
| DATED | : January 22, 2013 | |
| INVENTOR(S) | : Ogawa | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 0 days.

Signed and Sealed this
Seventeenth Day of September, 2013

Teresa Stanek Rea
*Deputy Director of the United States Patent and Trademark Office*